US010374027B2

(12) United States Patent
Choi

(10) Patent No.: US 10,374,027 B2
(45) Date of Patent: *Aug. 6, 2019

(54) ORGANIC LIGHT EMITTING DIODE DISPLAY DEVICE AND METHOD FOR MANUFACTURING THE SAME

(71) Applicant: LG Display Co., Ltd., Seoul (KR)

(72) Inventor: Hee Dong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 106 days.

This patent is subject to a terminal disclaimer.

(21) Appl. No.: 15/826,557

(22) Filed: Nov. 29, 2017

(65) Prior Publication Data

US 2018/0083087 A1     Mar. 22, 2018

Related U.S. Application Data

(63) Continuation of application No. 15/203,624, filed on Jul. 6, 2016, now Pat. No. 9,881,987, which is a
(Continued)

(30) Foreign Application Priority Data

Sep. 20, 2011   (KR) ........................ 10-2011-0094832

(51) Int. Cl.
  *H01L 27/32*   (2006.01)
  *H01L 51/52*   (2006.01)
  *H01L 27/12*   (2006.01)

(52) U.S. Cl.
  CPC ...... *H01L 27/3276* (2013.01); *H01L 27/3246* (2013.01); *H01L 27/3258* (2013.01);
(Continued)

(58) Field of Classification Search
  CPC ............. H01L 27/3276; H01L 27/3246; H01L 27/3258; H01L 27/3262; H01L 51/5228; H01L 27/1214; H01L 2227/323
  See application file for complete search history.

(56) References Cited

U.S. PATENT DOCUMENTS 6,703,792 B2   3/2004  Kawada et al.
7,525,143 B2   4/2009  Chae
(Continued)

FOREIGN PATENT DOCUMENTS

JP    2005266667    9/2005
JP    2005338789    12/2005
(Continued)

OTHER PUBLICATIONS

Japanese Patent Office, Office Action, Japanese Patent Application No. 2012-205772, dated Oct. 8, 2013, four pages.
(Continued)

*Primary Examiner* — Sejoon Ahn

(74) *Attorney, Agent, or Firm* — Fenwick & West LLP

(57) ABSTRACT

An OLED display device includes a display area of a substrate to display images; a non-display area surrounding the display area and applying signals to pixels within the display area; a first thin film transistor formed in the non-display area of the substrate; a second thin film transistor formed in the display area of the substrate; a planarization film formed over the first and second thin film transistors; a first electrode formed on the planarization film in the non-display area and formed with at least one first opening; a second electrode formed on the planarization film and connected to a electrode of the second thin film transistor; a bank pattern formed on the second electrode and the first electrode and exposing a part of the second electrode. The bank pattern is adjacent to the first electrode.

13 Claims, 6 Drawing Sheets

Related U.S. Application Data continuation of application No. 13/622,799, filed on Sep. 19, 2012, now Pat. No. 9,412,801.

(52) U.S. Cl.
CPC ...... *H01L 27/3262* (2013.01); *H01L 51/5228* (2013.01); *H01L 27/1214* (2013.01); *H01L 2227/323* (2013.01)

(56) References Cited

U.S. PATENT DOCUMENTS

| | | | |
|---|---|---|---|
| 7,538,488 | B2 | 5/2009 | Kwak |
| 8,188,473 | B2 | 5/2012 | Bang et al. |
| 8,278,664 | B2 | 10/2012 | Hwang et al. |
| 8,319,234 | B2 | 11/2012 | Jeong et al. |
| 8,604,490 | B2 | 12/2013 | Yuasa |
| 2004/0012549 | A1 | 1/2004 | Nishikawa |
| 2004/0069987 | A1 | 4/2004 | Yoneda et al. |
| 2004/0263441 | A1 | 12/2004 | Tanaka et al. |
| 2005/0030268 | A1 | 2/2005 | Zhang et al. |
| 2006/0060850 | A1 | 3/2006 | Kwak et al. |
| 2006/0113900 | A1 | 6/2006 | Oh |
| 2006/0170634 | A1 | 8/2006 | Kwak et al. |
| 2006/0292763 | A1 | 12/2006 | Hwang et al. |
| 2007/0007534 | A1 | 1/2007 | Kim et al. |
| 2007/0159099 | A1 | 7/2007 | Takahashi et al. |
| 2007/0194699 | A1 | 8/2007 | Lee et al. |
| 2007/0285369 | A1 | 12/2007 | Park et al. |
| 2008/0012797 | A1 | 1/2008 | Kil |
| 2008/0150848 | A1 | 6/2008 | Chung et al. |
| 2008/0157744 | A1 | 7/2008 | Jinta |
| 2008/0158496 | A1 | 7/2008 | Kim et al. |
| 2008/0283836 | A1 | 11/2008 | Lee |
| 2009/0008642 | A1 | 1/2009 | Kim et al. |
| 2009/0009068 | A1* | 1/2009 | Fujimura ............ H01L 27/3276 313/504 |
| 2009/0026446 | A1* | 1/2009 | Lee ..................... H01L 27/3211 257/40 |
| 2009/0033215 | A1* | 2/2009 | Horikiri .............. H01L 27/3246 313/504 |
| 2010/0065849 | A1 | 3/2010 | Lee et al. |
| 2010/0155733 | A1 | 6/2010 | Moon et al. |
| 2010/0182267 | A1 | 7/2010 | Lee et al. |
| 2010/0182303 | A1 | 7/2010 | Takasugi et al. |
| 2010/0213482 | A1 | 8/2010 | Kim et al. |
| 2011/0045911 | A1 | 2/2011 | Parham |
| 2011/0134104 | A1 | 6/2011 | Yoon |
| 2011/0163331 | A1 | 7/2011 | Yamazaki et al. |
| 2011/0164198 | A1 | 7/2011 | Shin |
| 2011/0169792 | A1 | 7/2011 | Shimizu et al. |
| 2011/0198572 | A1 | 8/2011 | Park et al. |
| 2011/0254757 | A1 | 10/2011 | Kim |
| 2011/0285689 | A1 | 11/2011 | Kim et al. |
| 2011/0297942 | A1 | 12/2011 | Kim et al. |
| 2011/0304652 | A1 | 12/2011 | Korthuis et al. |
| 2012/0013593 | A1 | 1/2012 | Yamamoto |
| 2012/0044444 | A1 | 2/2012 | Park et al. |
| 2012/0080664 | A1 | 4/2012 | Kim et al. |
| 2012/0105381 | A1 | 5/2012 | Lee et al. |
| 2012/0146059 | A1 | 6/2012 | Moon et al. |
| 2012/0268002 | A1 | 10/2012 | Osako et al. |
| 2013/0032802 | A1 | 2/2013 | Kim et al. |
| 2013/0087770 | A1 | 4/2013 | Son et al. |
| 2013/0140529 | A1 | 6/2013 | Seong et al. |
| 2013/0167911 | A1 | 7/2013 | Ikenaga et al. |

FOREIGN PATENT DOCUMENTS

| | | |
|---|---|---|
| JP | 2006156374 | 6/2006 |
| JP | 2007188895 | 7/2007 |
| JP | 2009059701 | 3/2009 |
| JP | 2011044417 | 3/2011 |
| WO | WO 2011/045911 | 4/2011 |

OTHER PUBLICATIONS

Japan Patent Office, Office Action, Japanese Patent Application No. 2015-146376, dated May 17, 2016 [with concise explanation of relevance in English].

Office Action for Japanese Patent Application No. JP 2015-146376, dated Nov. 7, 2017, 9 Pages (With English Translation).

United States Office Action, U.S. Appl. No. 13/622,799, dated Dec. 16, 2015, 24 Pages.

United States Office Action, U.S. Appl. No. 13/622,799, dated May 21, 2015, 21 Pages.

United States Office Action, U.S. Appl. No. 13/622,799, dated Jan. 29, 2015, 26 Pages.

United States Office Action, U.S. Appl. No. 13/622,799, dated Jul. 8, 2014, 14 Pages.

* cited by examiner

ORGANIC LIGHT EMITTING DIODE DISPLAY DEVICE AND METHOD FOR MANUFACTURING THE SAME

CROSS-REFERENCE TO RELATED APPLICATIONS

This application is a continuation of U.S. patent application Ser. No. 15/203,624 filed on Jul. 6, 2016, which is a continuation of U.S. patent application Ser. No. 13/622,799 filed on Sep. 19, 2012 (issued as U.S. Pat. No. 9,412,801), which claims priority under 35 U.S.C. 119(a) to Korean Patent Application No. 10-2011-0094832 filed on Sep. 20, 2011, which are hereby incorporated by reference in their entirety.

BACKGROUND

Field of the Disclosure

This disclosure relates an organic light emitting diode display device, and more particularly to an organic light emitting diode display device and a manufacturing method thereof which are adapted to enhance reliability.

Description of the Related Art

Various kinds of flat panel display devices that can replace heavy and bulky cathode ray tubes (CRTs) have been recently developed. Examples of the flat panel display devices include a liquid crystal display (LCD) device, a field emission display (FED) device, a plasma display panel (PDP), and a light-emitting diode display device.

The light-emitting diode display device is classified into an inorganic light-emitting diode display device and an organic light-emitting diode (OLED) display device according to the material of a light emission layer. Such a light-emitting diode display device has good characteristics, including a rapid response time, a high light-emitting efficiency, a high brightness, and a wide viewing angle because of being self-luminous.

The OLED includes an organic light-emitting compound layer configured to emit light, and an anode electrode and a cathode electrode facing each other with the organic light-emitting compound layer therebetween. The organic light-emitting compound layer includes a hole injection layer HIL, a hole transport layer HTL, an emission layer EML, an electron transport layer ETL and an electron injection layer EIL.

Such an OLED injects holes and electrons to the emission layer EML each through the cathode and anode electrodes and enables the emission layer to emit light by energy from excitons which are generated in an excitation process that the holes and the electrons are recombined with each other in the emission layer EML. In accordance therewith, the OLED display device electrically controls the quantity of light generated in the emission layer EML of the OLED and displays an image.

The OLED display device includes a thin film transistor (TFT), a planarization film formed in such a manner as to cover the TFT, an anode electrode connected to the TFT, a bank pattern formed on the TFT and the anode electrode, an organic light-emitting compound layer formed on the bank pattern and the anode electrode, and a cathode electrode formed on the organic light-emitting compound layer.

The OLED display device includes a buffer layer, a semiconductor active pattern, a gate insulation film, a gate metal pattern, an interlayer insulation film, a source/drain metal pattern and a passivation film which are sequentially formed on a substrate. The gate metal pattern includes a gate electrode of the TFT. The source/drain metal pattern includes source and drain electrodes of the TFT. The anode electrode is connected to the drain electrode of the TFT through a contact hole which penetrates through the passivation film.

Such an OLED display device can be defined into a display area used to display images and a non-display area surrounding edges of the display area. In the non-display area, a circuit portion and a ground connection portion can be formed. The circuit portion is used to apply drive voltages to a plurality of drive lines formed in the display area.

Similarly to the display area, another TFT, the planarization film, the anode electrode and so on are formed in the circuit portion of the non-display area.

However, residual materials within the planarization film formed in the circuit portion of the non-display area can be out-gassed with the lapse of time. The out-gassed residual materials affect the organic light-emitting compound layer formed in the display area. Due to this, the organic light-emitting compound layer can deteriorate.

The deterioration of the organic light-emitting compound layer causes faults and forces the reliability of the OLED display device to deteriorate.

BRIEF SUMMARY

Accordingly, the present embodiments are directed to an OLED display device that substantially obviates one or more of problems due to the limitations and disadvantages of the related art, and a method of manufacturing the same.

An object of the present embodiments is to provide an OLED display device and a manufacturing method of thereof that are adapted to minimize the movement of out-gassed materials from a circuit portion of a non-display area toward a display area and prevents the deterioration of an OLED within the display area, by forming holes in an anode electrode within the circuit portion.

Another object of the present embodiments is to provide an OLED display device and a manufacturing method thereof that are adapted to enhance the reliability.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an OLED display device includes: a display area defined in a substrate and configured to display images; a non-display area defined to include the circumference of the display area and configured to apply signals to pixels within the display area; a first thin film transistor formed in the non-display area of the substrate; a second thin film transistor formed in the display area of the substrate; a planarization film formed over the first and second thin film transistors; a first electrode formed on the planarization film in the non-display area and configured to include at least one first opening; a second electrode formed on the planarization film and connected to a electrode of the second thin film transistor; a bank pattern formed on the second electrode and the first electrode and configured to expose a part of the second electrode, wherein the bank pattern is arranged to be adjacent to the first electrode; an organic light-emitting layer formed on the second electrode; and a third electrode formed on the organic light-emitting layer.

A method for manufacturing an OLED display device according to another general aspect of the present embodiment includes: preparing a substrate defined into a display area configured to display images, and a non-display area positioned at outer sides of the display area; forming first and second thin film transistors in the non-display area and the display area of the substrate, respectively; forming a planarization film having a first contact hole exposing a part of an electrode of the second thin film transistor, on the substrate provided with the first and second thin film transistors; forming a first electrode including at least one first opening and facing the first thin film transistor, on the planarization film provided with the first contact hole, and a second electrode, which is connected to the electrode of the second thin film transistor; forming a bank pattern, in which an opening exposing a part of the second electrode is formed, on the first electrode and the second electrode; forming an organic light-emitting layer on the anode electrode; and forming a third electrode on the organic light-emitting layer.

According to another general aspect of the present embodiment, an OLED display device includes: a display area defined in a substrate and configured to display images; a non-display area defined to include the circumference of the display area and configured to apply signals to pixels within the display area; a first thin film transistor formed in the non-display area of the substrate; a second thin film transistor formed in the display area of the substrate; a planarization film formed over the first and second thin film transistors; a first thin film transistor formed in the non-display area of the substrate and configured to guide materials out-gassed from the planarization film to be exhausted to the bank pattern; a second electrode formed on the planarization film and connected to a electrode of the second thin film transistor; a bank pattern formed on the second electrode and the first electrode and configured to expose a part of the second electrode, wherein the bank pattern is arranged to be adjacent to the first electrode; an organic light-emitting layer formed on the second electrode; and a third electrode formed on the organic light-emitting layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION

Reference will now be made in detail to the embodiments of the present disclosure, examples of which are illustrated in the accompanying drawings.

Figure 1:
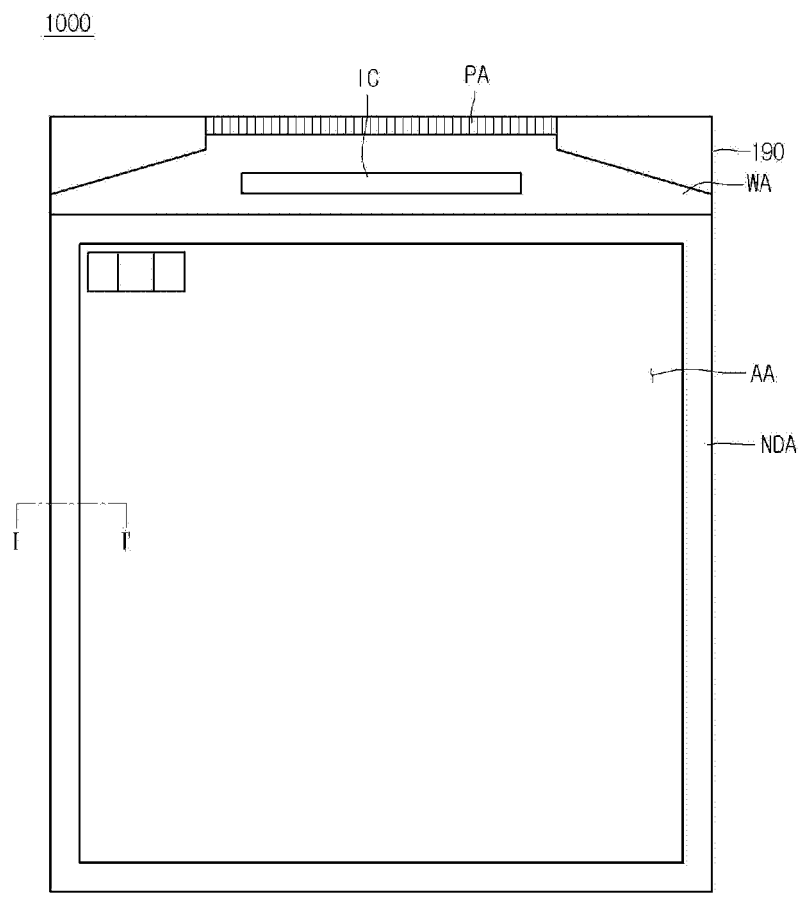
FIG. 1 is a plan view schematically showing an OLED display device according to an embodiment of the present disclosure.
Figure 2:
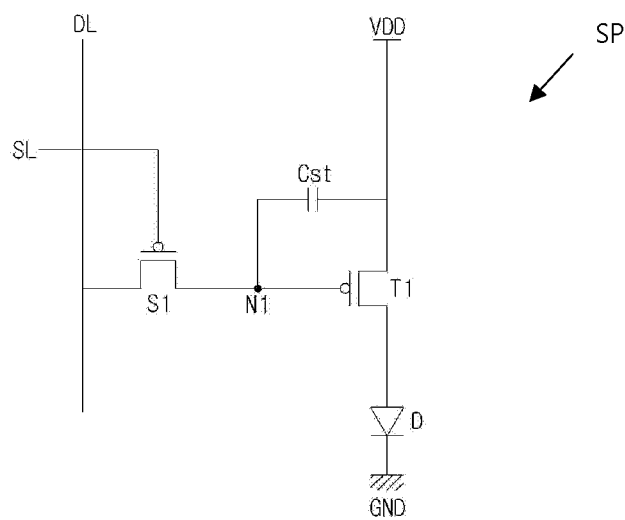
FIG. 2 is a circuitry diagram showing the circuit configuration of a pixel in FIG. 1.

FIG. 1 is a plan view schematically showing an OLED display device according to an embodiment of the present disclosure, and FIG. 2 is a circuitry diagram showing the circuit configuration of a pixel in FIG. 1. As shown in FIGS. 1 and 2, the OLED display device 1000 according to an embodiment of the present disclosure includes a substrate 190. The substrate 190 is defined into a display area AA used to display images and a non-display area NDA which surrounds edges of the display area AA and is loaded with circuit portions. The circuit portions are used to apply drive voltages to the display area AA.

The OLED display device can include a pad portion PA, a wiring portion WA and an integrated circuit (IC) chip which are disposed in the non-display area NDA. The wiring portion WA can include a plurality of wires used to guide a plurality of signals and a plurality of voltages, which are applied from the exterior through the pad portion PA, to the display area AA. The IC chip is electrically connected to pixels formed in the display area AA, through data lines formed in the display area AA.

The OLED display device can further include another circuit portion which is formed on the non-display area NDA of the substrate in a gate-in-panel (GIP) shape. Another circuit portion applies scan signals to the pixels SP through scan lines.

The pixels are arranged on the display area AA of the substrate 190 in a matrix shape. The pixels are connected to the IC chip through the data lines extending to the wiring portion WA. Also, the pixels are connected to another circuit portion through the scan lines extending to the wiring portion WA. Furthermore, the pixels are connected to a power source by power lines which pass through the wiring portion WA.

Each of the pixels can have a 2T1C (two transistors and one capacitor) configuration. In other words, the pixel can include a switching transistor, a drive transistor, a capacitor and an OLED. Alternatively, the pixel can be configured to further include still another transistor and another capacitor. The elements included in the pixel of the 2T1C configuration can be connected to one another as shown in FIG. 2.

The switching transistor S1 includes a gate electrode connected to the scan line SL to receive the scan signal. The switch transistor S1 further includes a source electrode connected to the data line DL to receive the data signal, and a drain electrode connected to a first node N1.

The drive transistor T1 includes a gate electrode connected to the first node N1. The drive transistor T1 further includes a source electrode connected to a first power line VDD to which a high voltage is applied, and a drain electrode connected to an anode electrode of the OLED D.

The capacitor Cst includes one end connected to the first node N1 and the other end connected to the first power line VDD. The OLED D includes the anode electrode connected to the drain electrode of the drive transistor T1, and a cathode electrode connected to a second power line GND to which a low voltage is applied.

FIG. 2 is described above with reference to using transistors S1 and T1 that are P-type transistors, as an example. However, the present embodiment is not limited to this.

The high voltage applied through the first power line VDD can be higher than the low voltage applied through the second power line GND. The high and low voltages applied through the first and second power lines VDD and GND can be exchanged for each other according to the drive mode of the pixel.

The above-mentioned pixel can be driven as follows. When the scan signal is applied through the scan line SL, the switching transistor S1 is turned on. As such, the data signal on the data line DL is applied to the first node N1 through the turned-on switching transistor S1 and stored in the capacitor Cst as a data voltage. The switching transistor S1 is turned-off when the scan signal is not applied to the scan line SL. Meanwhile, the drive transistor T1 is driven by the data voltage stored in the capacitor Cst. Then, the high voltage on the first power line VDD enables a current to flow towards the second power line GND, which causes the OLED to emit light. This drive method is provided as an example. As such, the present embodiment is not limited to this drive method.

The pad portion PA is disposed in an edge of the substrate 190. The pad portion PA is connected to an external substrate by an anisotropic conductive film or others. Also, the pad portion PA is connected to the wiring portion WA. Such a pad portion PA can transfer various drive signals, voltages and so on, which are applied from the external substrate, to the display area AA, the integrated circuit chip, the circuit portions and so on.

The wiring portion WA is used to transfer the transfer the various drive signals, the voltages and so on, which are applied from the pad portion PA, to the display area AA, the integrated circuit chip, the circuit portions and so on. To this end, the wiring portion WA can include data link lines used to transfer data signals to the integrated circuit chip IC, clock lines used to transfer clock signals and so on to the circuit portions, and power lines VDD and GND used to transfer the high and low voltages. Hereinafter, the power line used to transfer the low voltage will be referred to as a ground line.

Figure 3:
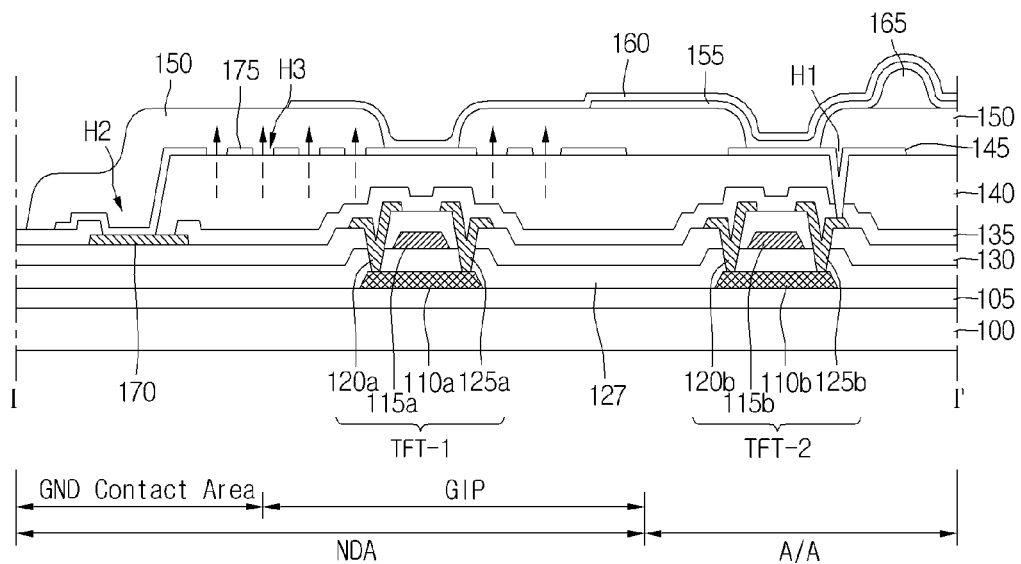
FIG. 3 is a cross-sectional diagram of the OLED display device taken along the line I-I' in FIG. 1.

FIG. 3 is a cross-sectional diagram of the OLED display device 1000 taken along the line I-I' in FIG. 1. As shown in FIGS. 1 and 3, the OLED display device 1000 can be defined into a display area AA and a non-display area NDA. The non-display area NDA can include a GIP area and a GND contact area.

The OLED display device 1000 can include first and second thin film transistors TFT-1 and TFT-2, a passivation film 135, a planarization film 140, a first electrode 175 and a second electrode 145, a bank pattern 150, an organic light-emitting compound layer 155, and a third electrode 160, which are sequentially formed on a substrate 100. The passivation film 135 is formed in such a manner to cover the first and second thin film transistors TFT-1 and TFT-2. The second and third electrodes 145 and 160 are either an anode electrode or a cathode electrode. If the second electrode 145 is an anode electrode, the third electrode 160 is a cathode electrode, and if the second electrode 145 is a cathode electrode, the third electrode is an anode electrode 160.

The first thin film transistor TFT-1 is formed in the GIP area of the non-display area NDA. The second thin film transistor TFT-2 is formed in the display area AA.

Also, the OLED display device 1000 can include a buffer layer 105, semiconductor active patterns 110a and 110b, a gate insulation film 127, a gate metal pattern, an interlayer insulation film 130, a source/drain metal pattern, and the passivation film 135, which are formed on the substrate 100.

The gate metal pattern can include gate electrodes 115a and 115b of the first and second thin film transistors TFT-1 and TFT-2. The source/drain metal pattern can include fourth and fifth electrodes 120a and 120b and sixth and seventh electrodes 125a and 125b of the thin film transistors TFT-1 and TFT-2 and a conductive pattern 170. The fourth, fifth, sixth and seventh electrodes 120a, 120b, 125a and 125b are either a drain electrode or a source electrode. If the fourth electrode 120a is a source electrode, the sixth electrode 125a is a drain electrode, and if the fourth electrode 120a is a drain electrode, the sixth electrode 125a is a source electrode. If the fifth electrode 120b is a source electrode, the seventh 125b electrode is a drain electrode, and if the fifth 120b electrode is a drain electrode, the seventh electrode 125b is a source electrode.

The second electrode 145 is electrically connected to the seventh electrode 125b of the second thin film transistor TFT-2 through a first contact hole H1. The first contact hole H1 is formed in such a manner as to penetrate through the planarization film 140 and the passivation film 135 within the display area AA. If the second electrode 145 is an anode electrode, the seventh electrode 125b is a drain electrode, and if the second electrode 145 is a cathode electrode, the seventh electrode 125b is a source electrode.

The first thin film transistor TFT-1 can include the first semiconductor active pattern 110a formed on the buffer layer 105, the first gate electrode 115a formed on the first semiconductor active pattern 110a with the gate insulation film 127 therebetween, and the fourth and sixth electrodes 120a and 125a formed on the first gate electrode 115a with the interlayer insulation film 130 therebetween. The fourth and sixth electrodes 120a and 125a are spaced a fixed distance from each other.

The second thin film transistor TFT-2 can include the second semiconductor active pattern 110b formed on the buffer layer 105, the second gate electrode 115b formed on the second semiconductor active pattern 110b with the gate insulation film 127 therebetween, and the fifth and seventh electrodes 120b and 125b formed on the second gate electrode 115b with the interlayer insulation film 130 therebetween. The fifth and seventh electrodes 120b and 125b are spaced a fixed distance from each other.

The first electrode 175 is formed on the non-display area NDA. The first electrode 175 is electrically connected to the conductive pattern 170 within the GND contact area through a second contact hole H2. At least one first opening H3 is formed in the first electrode 175 within the GIP area of the non-display area NDA. If a plurality of first openings H3 is formed in the first electrode 175 within the GIP area, they are spaced a fixed interval from one another.

The second electrode 145 disposed within the display area AA is formed from the same material and through the same process as the first electrode 175. However, the second electrode 145 is not connected electrically to the first electrode 175.

The first opening H3 formed in the first electrode within the GIP area can guide materials out-gassed from the planarization film 140 within the GIP area to be exhausted to the bank pattern 150. As such, the affection of the materials, which is out-gassed from the planarization film 140 within the GIP area, to be applied to the organic light-emitting compound layer 150 can be minimized. In accordance therewith, the deterioration of the organic light-emitting compound layer 150 can be prevented. As a result, the OLED display device according to the present embodiment can enhance the reliability. The above-mentioned configuration of the first electrode is one example of the first electrode 175 configured to guide materials out-gassed from the planarization film 140 within the GIP area to be exhausted to the bank pattern 150.

Figure 4:
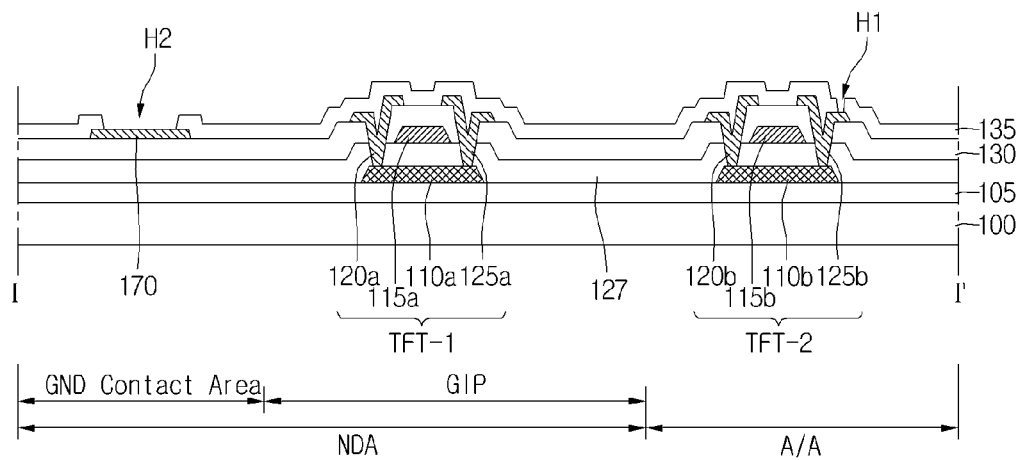
FIGS. 4 through 10 are cross-sectional diagrams illustrating processes of manufacturing the OLED display device of FIG. 1.

FIGS. 4 through 10 are cross-sectional views illustrating processes of manufacturing the OLED display device of FIG. 1. As shown in FIG. 4, processes of forming first and second thin film transistors TFT-1 and TFT-2 on a substrate 100 are performed. First, a buffer layer 105 is formed on the substrate 100 by depositing silicon oxide $SiO_2$ or silicon nitride SiNx on the substrate 100 using a chemical vapor deposition (CVD) technique. Then, first and second semiconductor active patterns 110a and 110b are formed on the buffer layer 105. The first and second semiconductor active patterns 110a and 110b can be prepared by forming first and second polysilicon patterns on the buffer layer 105 and doping p+ ions into the first and second polysilicon patterns. The first and second polysilicon patterns can also be formed by depositing n+-p hydrogenated amorphous silicon (a-Si:H) on the buffer layer 105 using the CVD technique, crystallizing the deposited n+-p hydrogenated amorphous silicon (a-Si:H) into a polysilicon layer, and patterning the polysilicon layer.

A gate insulation film 127 is formed on the buffer layer 105 in such a manner as to cover the first and second semiconductor active patterns 110a and 110b. The gate insulation film 127 is prepared by depositing silicon oxide $SiO_2$ or silicon nitride SiNx on the buffer layer 105 provided with the first and second semiconductor active patterns 110a and 110b.

Subsequently, first and second gate electrodes 115a and 115b are formed on the gate insulation film 127. The first and second gate electrodes 115a and 115b can be prepared by depositing a metal film on the gate insulation film 127 using a sputtering technique and patterning the deposited metal film through a first photolithograph process. The metal film can be formed from either at least one of aluminum Al, aluminum-neodymium AlNd and molybdenum or an alloy thereof.

An interlayer insulation film 130 is formed on the gate insulation film 127 in such a manner to cover the first and second gate electrodes 115a and 115b. The interlayer insulation film 130 can be prepared by depositing silicon oxide $SiO_2$ or silicon nitride SiNx on the gate insulation film 127 provided with the first and second gate electrodes 115a and 115b.

In succession, contact holes partially exposing the first and second semiconductor active patterns 110a and 110b are formed in the interlayer insulation film and the gate insulation film 127. The contact holes can be formed by continuously etching the interlayer insulation film 130 and the gate insulation film 127, which corresponding to positions in which fourth, fifth, sixth and seventh electrodes 120a, 120b, 125a and 125b will be formed, through a second photolithograph process.

Afterwards, the fourth, fifth, sixth and seventh electrodes 120a, 120b, 125a and 125b, which are connected to the first and second semiconductor active patterns 110a and 110b through the contact holes, are formed on the interlayer insulation film 130. The fourth, fifth, sixth and seventh electrodes 120a, 120b, 125a and 125b can be formed by depositing a source/drain metal film on the interlayer insulation film 130 using the CVD technique and patterning the deposited source/drain metal film through a third photolithograph process. The source/drain metal film can be formed in either a single layer or a stacked-layer structure, formed from molybdenum Mo, chromium Cr, copper Cu, alloys thereof and so on.

At the same time, a conductive pattern 170 is formed on the interlayer insulation film 130 within the GND contact area of the non-display area NDA. The conductive pattern 170 will be electrically connected to an external ground source.

Continuously, a passivation film 135 is formed on the interlayer insulation film 130 in such a manner as to cover the fourth, fifth, sixth and seventh electrodes 120a, 120b, 125a and 125b. The passivation film 135 can be formed by depositing one of silicon oxide $SiO_2$ and silicon nitride SiNx on the interlayer insulation film 130, which is provided with the fourth, fifth, sixth and seventh electrodes 120a, 120b, 125a and 125b, using the CVD technique. Alternatively, the passivation film 135 can be formed by coating an organic material on the interlayer insulation film 130 provided with the fourth, fifth, sixth and seventh electrodes 120a, 120b, 125a and 125b.

Also, first and second contact holes H1 and H2 are formed by patterning the planarization film 135 through a fourth photolithograph process. The first contact hole H1 exposes the seventh electrode 125b. The second contact hole H2 exposes a part of the conductive pattern 170 formed within the GND contact area of the non-display area NDA.

Figure 5:
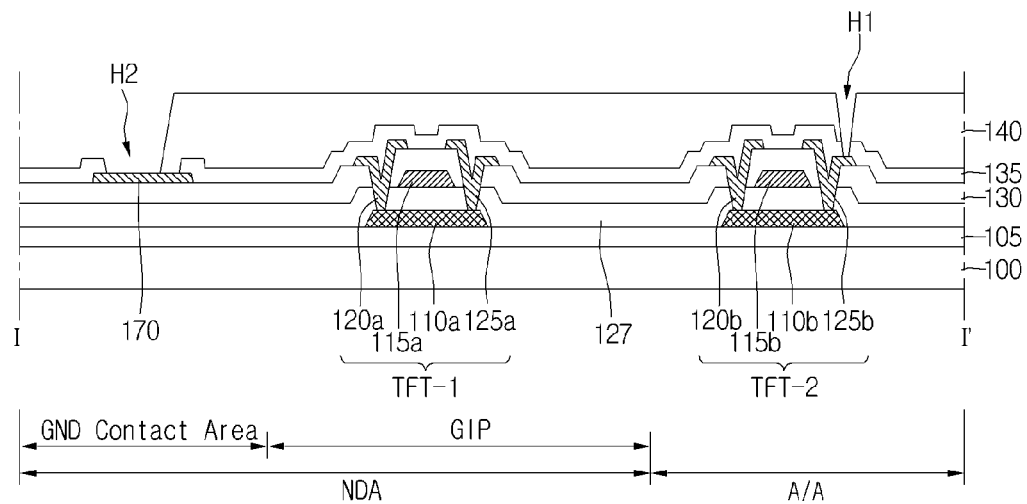

As shown in FIG. 5, a planarization film 140 is formed on the passivation film 135. The planarization film 140 can be formed by an organic liquid material, such as polyimide, a benzocyclobutene-based resin, acrylate or others, on the passivation film 135 and curing the spin-coated organic material. The planarization film 140 is patterned in order to expose the seventh electrode 125b corresponding to the first contact hole H1.

Figure 6:
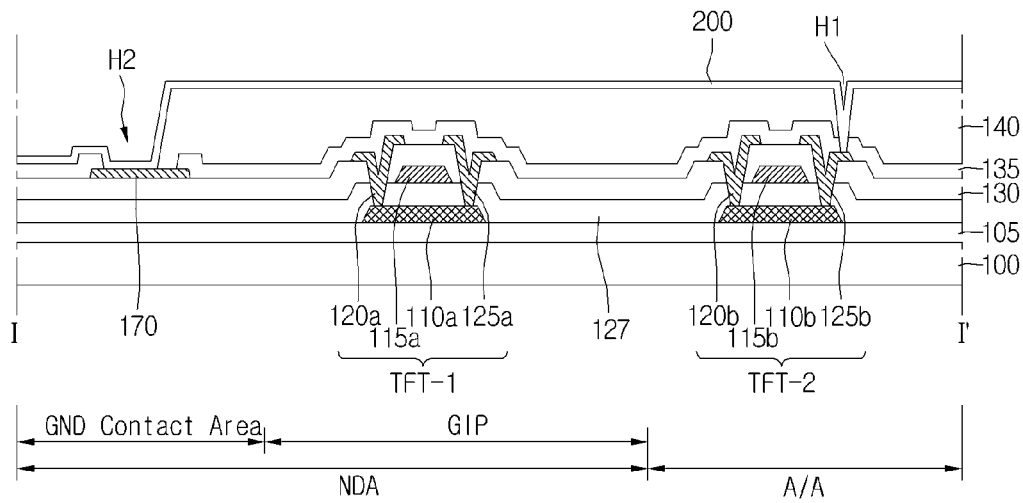

Subsequently, a transparent conductive film 200 is formed on the entire surface of the substrate 100 provided with the planarization film 140, as shown in FIG. 6. The transparent conductive film 200 can be prepared by depositing a transparent conductive material on the entire surface of the substrate 100, which is provided with the planarization film 140, using a sputtering technique. Also, the transparent conductive film 200 can be formed from one selected from a material group which includes indium-tin-oxide ITO, tin-oxide TO, indium-zinc-oxide IZO, indium-tin-zinc-oxide ITZO and so on. Also, a silver layer and a secondary transparent conductive material (not shown in the drawings) are sequentially formed on the substrate 100 covered with the transparent conductive film 200.

Figure 7:
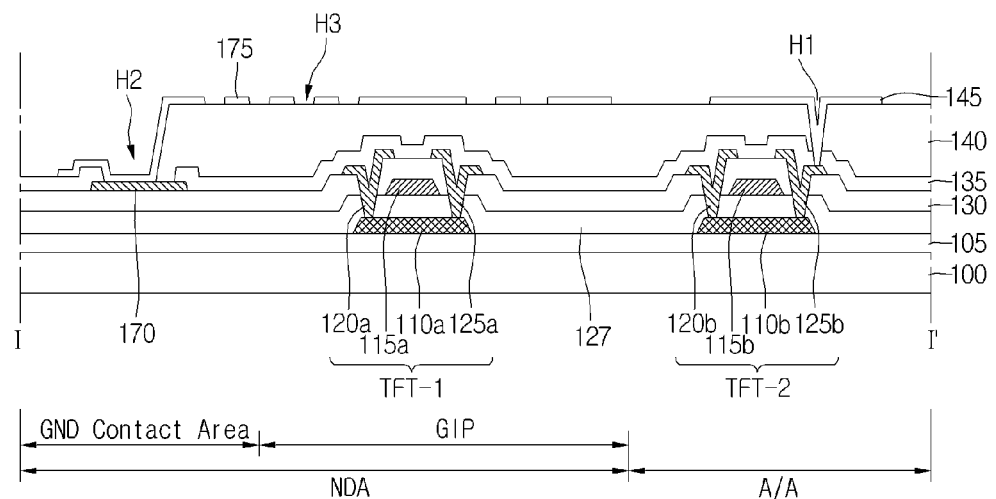

The transparent conductive film 200, the silver layer and the secondary transparent film are patterned into a second electrode 145 and a first electrode 175 through a fifth photolithograph process, as shown in FIG. 7. The second electrode 145 is disposed in the display area AA and the first electrode 175 is disposed within the non-display area NDA.

The second electrode 145 and the first electrode 175 are formed in a triple layered structure. The second electrode 145 formed in the display area AA is electrically connected to the seventh electrode 125b through the first contact hole H1.

The first electrode 175 formed within the non-display area NDA has at least one first opening H3 which is formed by the fifth photolithograph process. The at least one first opening H3 can include a plurality of first openings spaced a fixed interval from one another.

The at least one first opening H3 can be formed in the shape of a circle, a rhombus, or a rectangle, but it is not limited to these. The size of the first opening H3 depends the distance between the first openings H3.

Such a first electrode 175 disposed within the non-display area NDA is electrically connected to the conductive pattern 170 within the GND contact area of the non-display area NDA through the second contact hole H2. Therefore, the first electrode 175 can be used to transfer a ground voltage GND.

Figure 8:
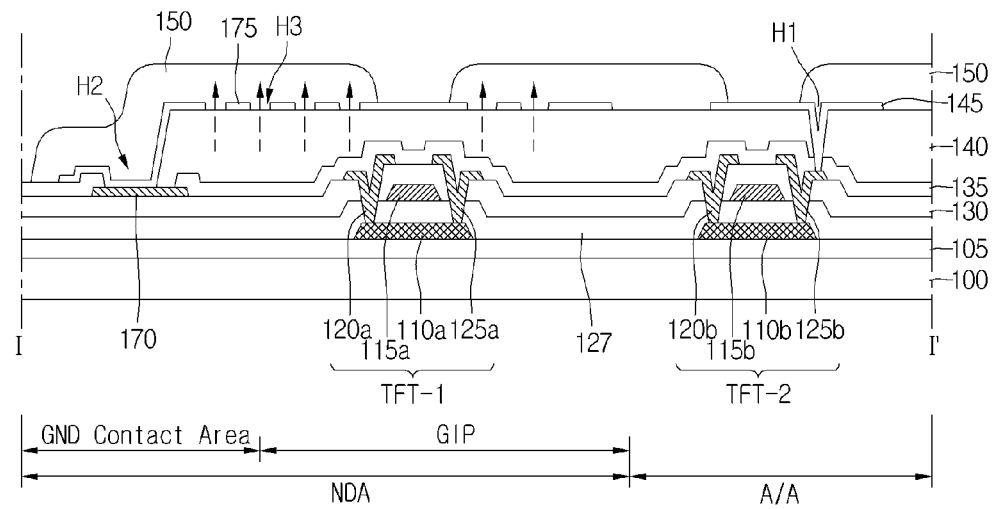

As shown in FIG. 8, a bank pattern 150 is formed on the substrate 100 provided with the second electrode 145 and the first electrode 175. The bank pattern 150 can be formed by coating an organic photo-resistive material, such as polyimide, photoresist or others, on the entire surface of the substrate 100 provided with the second electrode 145 and the first electrode 175, and patterning the coated organic photo-resistive material through a sixth photolithograph process. Such a bank pattern 150 is used to define light-emission cells.

Figure 9:
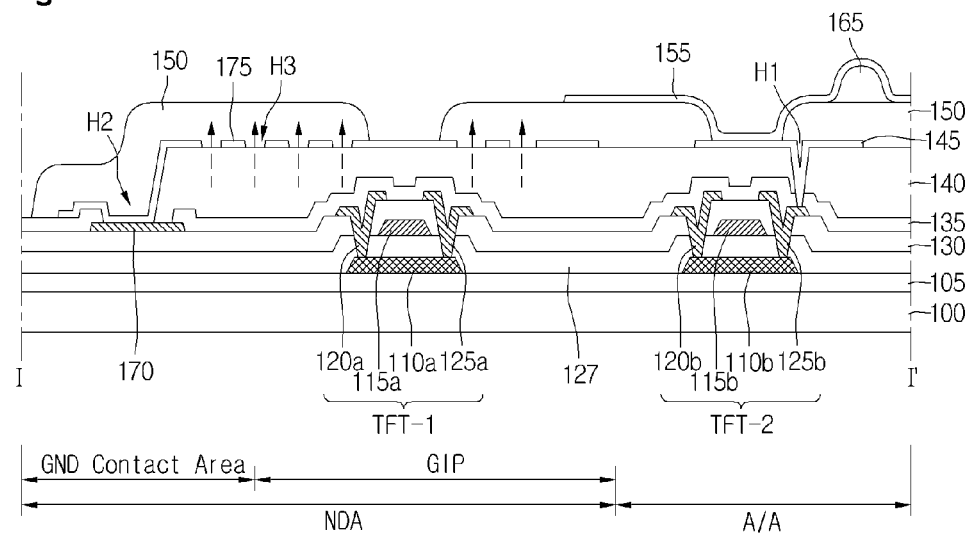

Thereafter, a spacer 165 and an organic light-emitting compound layer 155 are sequentially formed on the substrate 100 provided with the bank pattern 150, as shown in FIG. 9. The spacer 165 is formed from silicon oxide $SiO_2$ or silicon nitride SiNx. The organic light-emitting compound layer 155 is formed on the substrate 100 provided with the spacer 165. Also, the organic light-emitting compound layer 155 includes a hole injection layer, a hole transport layer, an emission layer, an electron transport layer and an electron injection layer. Such an organic light-emitting compound layer 155 is disposed on the second electrode 145 within the display area AA.

Figure 10:
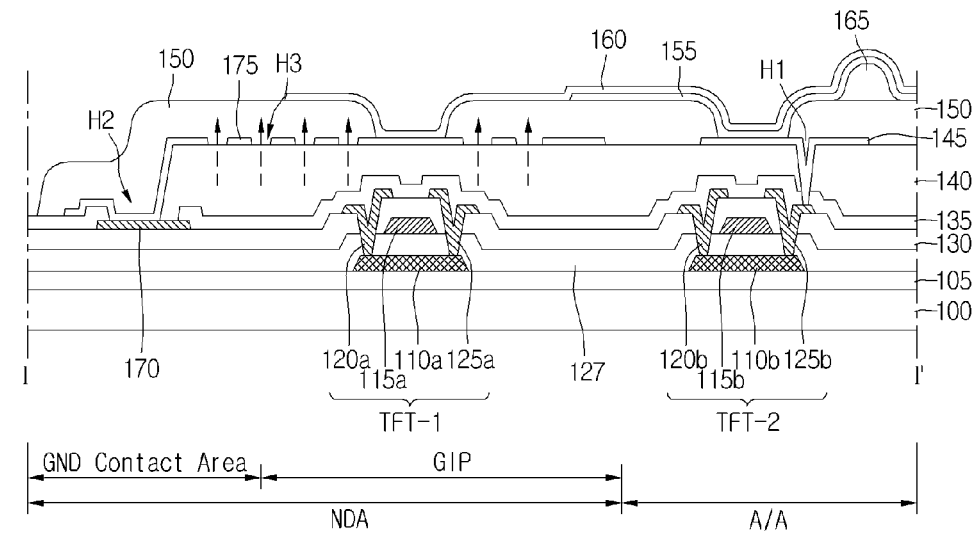

Next, a third electrode 160 is formed on the substrate 100 provided with the organic light-emitting compound layer 155, as shown in FIG. 10. The third electrode 160 can be formed by entirely depositing a metal such as aluminum or others on the substrate provided with the organic light-emitting compound layer 155 and patterning the deposited metal through a seventh photolithograph process.

The third electrode 160 is electrically connected to the first electrode 175 in the non-display area NDA. Also, the third electrode 160 is disposed on the organic light-emitting compound layer 155 within the display area AA.

In this manner, the OLED display device of the present embodiment allows at least one first opening H3 to be formed in the non-display area NDA. As such, materials out-gassed from the planarization film 140 within the non-display area NDA can be exhausted to the bank pattern 150 within the non-display area NDA via the first opening H3.

Consequently, the OLED device of the present embodiment can prevent the movement of the materials, which are out-gassed from the non-display area NDA, toward the display area AA. Therefore, the deterioration of the organic light-emitting compound layer 150 can be prevented. As a result, the OLED display device according to the present embodiment can enhance the reliability.

Figure 11:
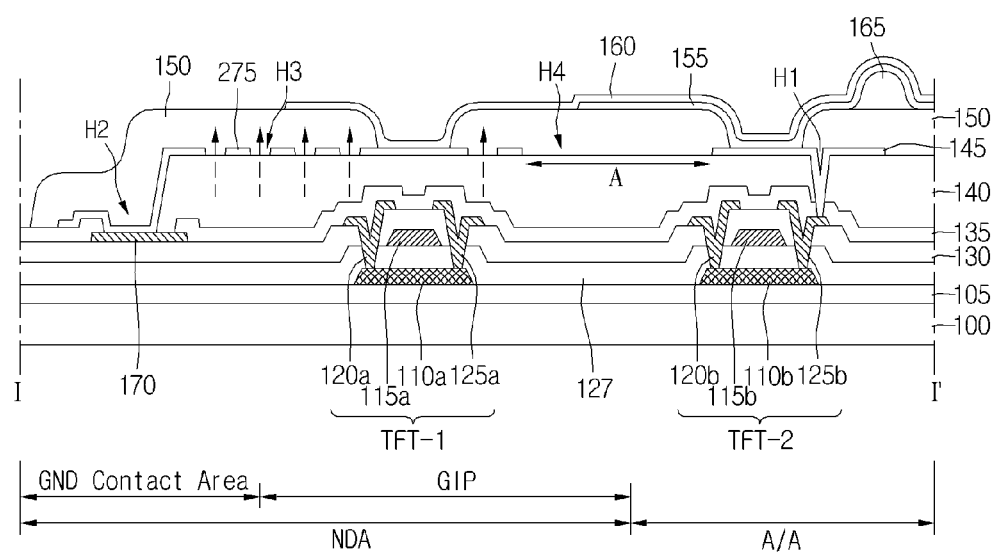
FIG. 11 is a cross-sectional diagram of an OLED display device taken along the line I-I' in FIG. 1, according to another embodiment of the present disclosure.

FIG. 11 is a cross-sectional view showing the cross-section of an OLED display device, which is taken along the line I-I' in FIG. 1, according to another embodiment of the present disclosure. The OLED display device of FIG. 11 is similar to the above-mentioned device. As such, components of the OLED display device of FIG. 11 that are the same as those of the above-mentioned device will be referenced using the same numerals. Also, the description regarding the components of the OLED display device of FIG. 11 that are the same as those of the above-mentioned device will be omitted herein for the sake of brevity.

As shown in FIGS. 1 and 11, the OLED display device of another embodiment is defined into a display area AA used to display images and a non-display area NDA surrounding edges of the display area AA. A first electrode 275 is formed in the non-display area AA. Also, at least one first opening H3 is formed in the first electrode 275.

In addition, a second opening H4 is further formed within the non-display area NDA. More specifically, the second opening H4 is formed between a second electrode 145 of an outer pixel within the display area AA and the first electrode 275 within the non-display area NDA.

Such a second opening H4 can enable the first electrode 275 to be separated by a fixed distance A, for example by at least one pixel, from the second electrode 145 of outer pixel within the display area AA.

In this manner, the first opening H3 and the second opening H4 are formed within the non-display area NDA. As such, materials out-gassed from the planarization film 140 within the non-display area NDA can be exhausted to the bank pattern 150 within the non-display area NDA via the first opening H3 and the second opening H4.

Consequently, the OLED device of another embodiment can prevent the movement of the materials, which are out-gassed from the non-display area NDA, toward the display area AA. Therefore, the deterioration of the organic light-emitting compound layer 150 can be prevented. As a result, the OLED display device according to the present embodiment can enhance the reliability.

The structure of the OLED display device according to the present disclosure is not limited to the above-mentioned embodiments. In other words, the OLED display device according to the present disclosure can include any array structure which has a hole within the non-display area.

The ordinary skilled person in the art should understand that various changes or modifications of the present disclosure are possible without departing from the technical spirit or the essential features of the present disclosure. As such, it should be understood by the ordinary skilled person in the art that the above-mentioned embodiments are provided as examples of the present disclosure, but the present disclosure is not limited these embodiments. Accordingly, the scope of the present disclosure shall be determined only by the appended claims and their equivalents. Moreover, it should be considered that alternative uses derived from the meaning, scope and their equivalent concepts defined in the claims are included in the scope of the present disclosure.

What is claimed is:

1. An organic light-emitting diode display device comprising:
   a substrate defined with a display area having pixels to display images and a non-display area having a gate-in-panel (GIP) area and a ground contact area to supply signals to the display area;
   transistors on the non-display area and the display area of the substrate;
   a planarization film over the transistors;
   a first electrode on the planarization film and including a plurality of first openings formed within the GIP area of the non-display area and a second opening formed within the non-display area;
   a second electrode on the planarization film in the display area and connected to a transistor in a pixel of the display area;

a bank pattern on the first electrode and the second electrode and arranged to cover at least one of the plurality of first openings in the first electrode; and an organic light-emitting layer on the second electrode, wherein the second opening is formed between the second electrode within the display area and the first electrode within the non-display area, wherein at least one portion of the second opening is within the GIP area, wherein at least one among the first openings and the second opening exposes a portion of the planarization film, wherein the first electrode and anode patterns include a same material, wherein a width of the second opening is wider than that of a pixel in the display area, and wherein the second electrode is connected to the first electrode exposed by the bank pattern in the GIP region.

2. The organic light-emitting diode display device of claim 1, wherein the second electrode of an outermost pixel within the display area is spaced a distance from the first electrode within the non-display area by a single pixel width.

3. The organic light-emitting diode display device of claim 1, wherein the first electrode within the non-display area and the second electrode within the display area are formed from a same material.

4. The organic light-emitting diode display device of claim 1, wherein the first electrode within the non-display area and the second electrode within the display area each include: a transparent electrode formed from one of indium-tin-oxide (ITO), tin-oxide (TO), indium-zinc-oxide (IZO) and indium-tin-zinc-oxide (ITZO); a silver layer formed on the transparent electrode; and a secondary transparent electrode formed on the silver layer.

5. The organic light-emitting diode display device of claim 1, wherein the ground contact area is positioned at an outer side of the GIP area and used for a ground connection.

6. A display device comprising:
a substrate defined with a display area having pixels to display images and a non-display area having a gate-in-panel (GIP) area and a ground contact area to supply signals to the display area;
a plurality of transistors on the display area and the GIP area of the non-display area;
a planarization film on the plurality of transistors;
a plurality of anode patterns, on the planarization film, connected to the transistors within the display area;
a first electrode, on the planarization film, having a plurality of out gassing holes on the GIP area;
an opening between the anode patterns within the display area and the first electrode within the non-display area; and
a cathode electrode of the display area connected to the first electrode on the GIP area,
wherein at least one portion of the opening is within the GIP region,
wherein at least one among the out gassing holes and the opening exposes a portion of the planarization film,
wherein the first electrode and the anode patterns include a same material,
wherein a width of the opening is wider than that of a pixel in the display area, and wherein the cathode electrode is connected to the first electrode exposed by bank pattern in the GIP region.

7. The display device of claim 6, wherein the first electrode and the anode patterns include: a transparent electrode formed from one of indium-tin-oxide (ITO), tin-oxide (TO), indium-zinc-oxide (IZO) and indium-tin-zinc-oxide (ITZO).

8. The display device of claim 6, further comprising:
a bank pattern on the anode patterns and the first electrode, the bank pattern configured to expose a part of the anode patterns and the first electrode and cover a part of the out gassing holes in the first electrode
a conductive pattern connected to the first electrode on the substrate in the ground contact area to supply a voltage to the cathode electrode.

9. The display device of claim 8, wherein the bank pattern covers at least a portion of the opening between the anode patterns within the display area and the first electrode within the non-display area.

10. The display device of claim 8, wherein the cathode electrode is extended to the GIP area and contacted with the first electrode exposed by the bank pattern on the GIP area.

11. An apparatus comprising:
a substrate having a display area to display images and a non-display area having a gate-in-panel (GIP) region and a ground contact region around the display area;
a planarization film on the substrate;
anode patterns on the planarization film in the display area;
a conductive structure, to guide materials out-gassed from the planarization film, in the GIP region and in the ground contact region;
a bank pattern exposing at least a portion of the anode patterns in the display area and at least a portion of the conductive structure in the non-display area; and
a cathode connected to the conductive structure in the GIP region,
wherein the conductive structure has a first opening within the GIP region of the non-display area,
wherein a second opening is between the anode patterns within the display area and the conductive structure within the non-display area,
wherein at least one portion of the second opening is within the GIP region,
wherein at least one among the first opening and the second opening exposes a portion of the planarization film,
wherein the conductive structure and the anode patterns include a same material,
wherein a width of the second opening is wider than that of a pixel in the display area, and
wherein the cathode is connected to the conductive structure exposed by the bank pattern in the GIP region.

12. The apparatus according to claim 11, further comprising:
a ground electrode in the ground contact region around the GIP region,
wherein the planarization film exposes the ground electrode in the ground contact region.

13. The apparatus according to claim 12, wherein the ground electrode is connected to the conductive structure in the ground contact region.

* * * * *